United States Patent
Burke, Jr. et al.

(10) Patent No.: US 6,941,232 B2
(45) Date of Patent: Sep. 6, 2005

(54) METHOD AND APPARATUS FOR PERFORMING MULTI-SITE INTEGRATED CIRCUIT DEVICE TESTING

(75) Inventors: Dennis Harold Burke, Jr., Allen, TX (US); Michael Lee Martel, Richardson, TX (US); Gunvant T. Patel, Garland, TX (US)

(73) Assignee: Texas Instruments Incorporated, Dallas, TX (US)

(*) Notice: Subject to any disclaimer, the term of this patent is extended or adjusted under 35 U.S.C. 154(b) by 165 days.

(21) Appl. No.: 10/367,521

(22) Filed: Feb. 14, 2003

(65) Prior Publication Data

US 2004/0162682 A1 Aug. 19, 2004

Related U.S. Application Data

(60) Provisional application No. 60/443,103, filed on Jan. 28, 2003.

(51) Int. Cl.[7] .............................................. G01R 15/00
(52) U.S. Cl. ........................... 702/57; 702/89; 702/118
(58) Field of Search ................................. 714/742, 738, 714/734, 724, 32; 702/89, 57, 118; 324/765, 73.1

(56) References Cited

U.S. PATENT DOCUMENTS

| | | | |
|---|---|---|---|
| 5,666,049 A | 9/1997 | Yamada et al. ........... 324/158.1 |
| 6,145,104 A | * 11/2000 | Feddeler et al. ............. 714/724 |
| 6,363,510 B1 | 3/2002 | Rhodes et al. .............. 714/738 |
| 6,477,685 B1 | 11/2002 | Lovelace | |
| 6,574,760 B1 | 6/2003 | Mydill | |
| 2002/0021140 A1 | 2/2002 | Whetsel ...................... 324/765 |

FOREIGN PATENT DOCUMENTS

EP 0 283 186 A2 9/1988

OTHER PUBLICATIONS

Bedsole et al., "Very Low Cost Testers: Opportunities and Challenges", IEEE Design & Test of Computers, Sep.–Oct. 2001.

* cited by examiner

Primary Examiner—Michael Nghiem
Assistant Examiner—Stephen J. Cherry
(74) Attorney, Agent, or Firm—Yingsheng Tung; Wade James Brady, III; Frederick J. Telecky, Jr.

(57) ABSTRACT

Disclosed herein is an improved method and apparatus for simultaneously performing tests on several devices at the same time. An aspect of one embodiment of the invention is an improved DMA controller that automatically selects certain pin groups, which are connected to a common data bus, to receive test data words from a common data bus. By selecting more than one pin group at the same time, test data (such as a test data word) can be simultaneously loaded onto multiple pin cards at the same time. By loading this data into multiple pin cards at the same time, test data can be "fanned-out" to multiple pin cards and thereby be sent to multiple device sites at the same time. Another aspect of one embodiment of the invention utilizes DMA-based hardware to select which pin groups should received "fanned-out" test data. By utilizing DMA-based hardware to fan-out the test data, the software-based test programs and patterns may be created to manipulate a single device. The test program may select the number of sites to be tested and partition the tester resources to those sites. The DMA-based hardware and tester software will automatically fan-out the test data to all of the appropriate test sites.

11 Claims, 15 Drawing Sheets

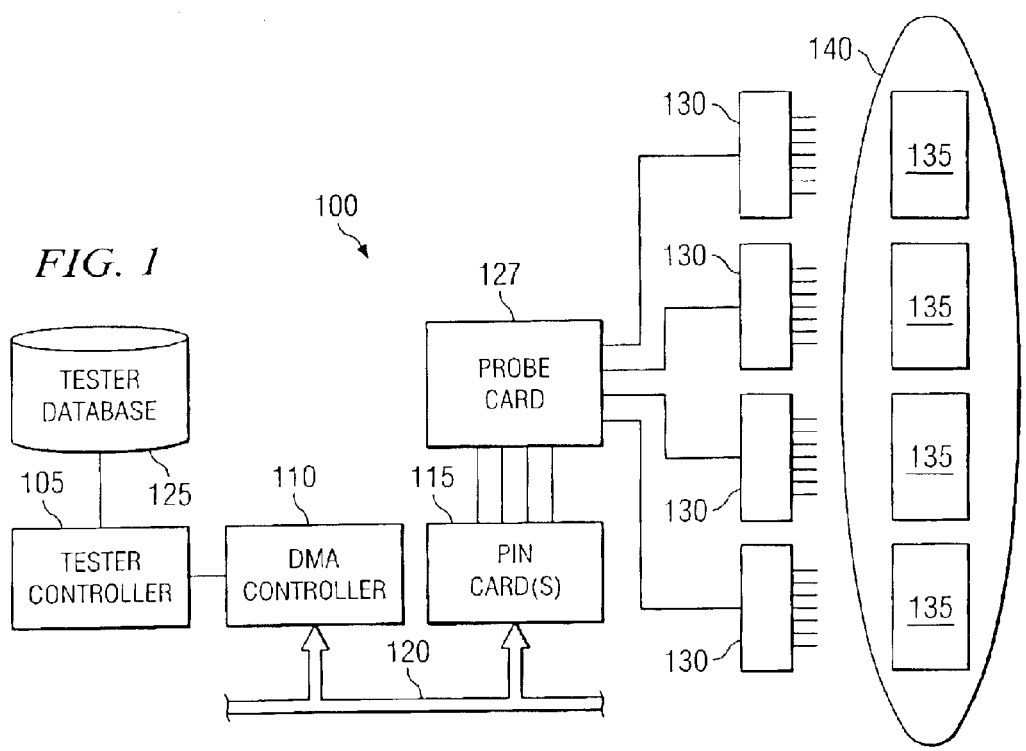
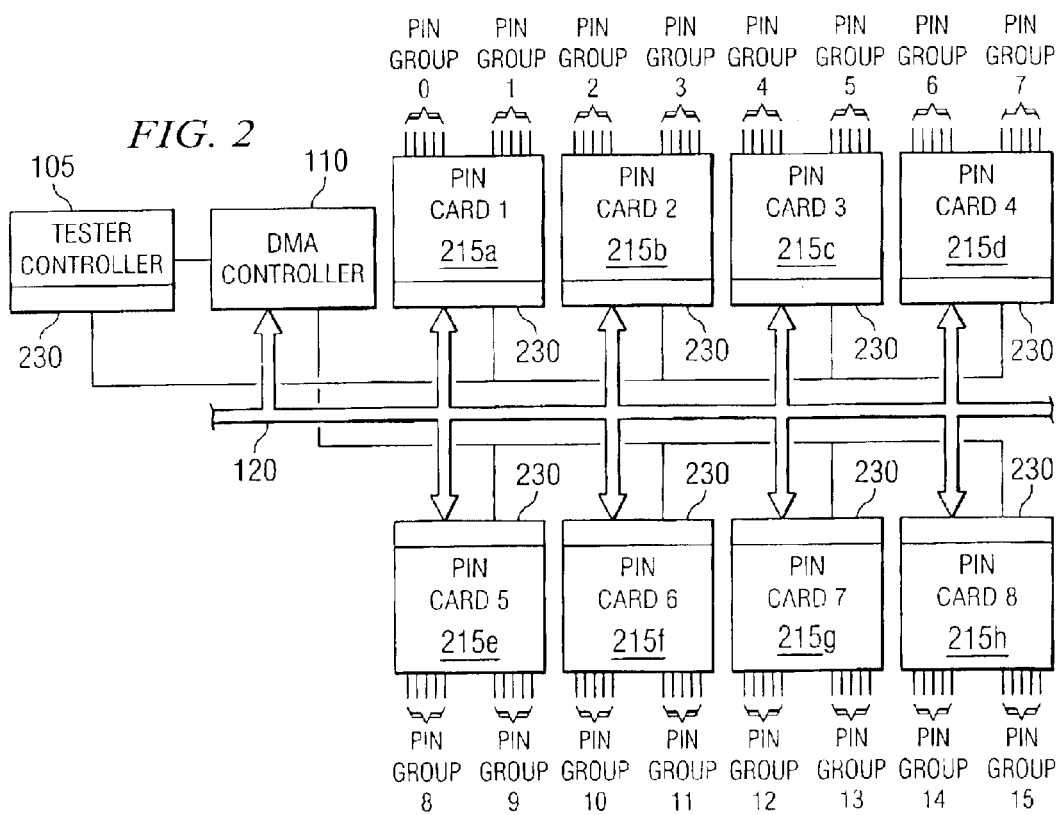

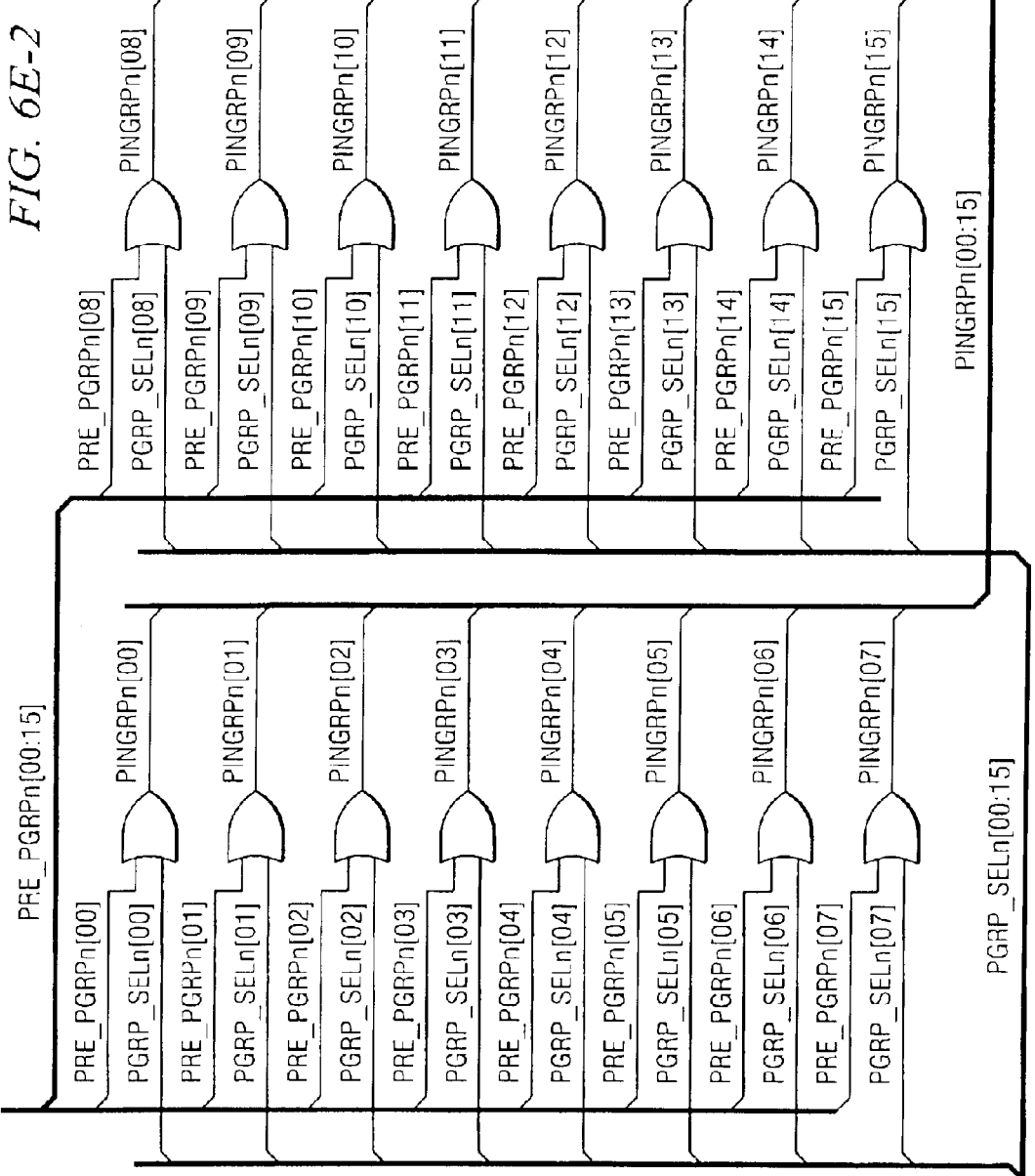

METHOD AND APPARATUS FOR PERFORMING MULTI-SITE INTEGRATED CIRCUIT DEVICE TESTING

CROSS REFERENCE TO RELATED APPLICATION(S)

This application claims priority to provisional patent application No. 60/443,103, now abandoned, entitled "Flexible Method to Perform Multi-Site IC Device Testing," having the same inventors listed above and which was filed on Jan. 28, 2003. The content of that provisional application is hereby incorporated by reference into this application.

BACKGROUND

The process of fabricating an integrated circuit includes material preparation, circuit fabrication, wafer-probe testing, assembly, final testing and shipment. Initially a silicon ingot is cut to create individual wafers. This group of wafers are commonly referred to as a 'lot,' whereby each wafer is referred to by lot number, wafer number, resistivity, etc. Circuit fabrication may include several subsequent steps of diffusion, ion implantation, photolithography and plasma etch. Typical integrated circuit fabrication processes include deposition and growth of a thin film on the surface of the wafer, transferring a circuit pattern to a masking layer on the film, removing areas of the film not protected by the masking layer and doping exposed areas of the wafer. These steps may be repeated depending upon the process, whether bipolar, MOS, CMOS or BiCMOS. Each one of these processes, as well as other factors such as handling, inherent crystal defects, or misprocessing, can produce a defect resulting in a device failure. Once each individual circuit or die is complete, it will be tested by a wafer probe to evaluate its functionality. The purpose of wafer-probe testing is two-fold: to identify and discard non-functional devices before they are subjected to costly back-end processes; and to gain information regarding fabrication process parameters so that problems can be identified and corrected on a timely basis.

Although the level of automation differs from system to system, almost all wafer-probe systems are programmable. Test data is typically transmitted to a tester controller database. The key components of a typical wafer-probe system include a microprocessor based tester controller, a tester module or subsystem comprising one or more pin cards, a probe card, and a prober. One or more microprocessors control the tester module and prober as well as serve to provide data collection, storage and transmission. The tester module, and its constituent pin cards, generates the input voltages, currents, and waveforms required to test the device. The tester module also measures voltages, currents and waveforms output from the device. The prober is the system component that actually handles the wafers. The prober moves the wafers in the x and y directions to align bonding pads of each die with the probe pin tips. It then raises the wafer to make contact with the probe tips and lowers the wafer after testing each die. The probe card is a printed circuit board or other assembly that holds the actual probe tips. The interface extending between the testing module and the prober is a cable interface.

The actual testing of the devices is software-driven in a sequence that includes continuity testing, functional testing, and parametric testing. Continuity testing is a very basic test to check whether a device turns on, if it is shorted, or if it has other fundamental flaws. Functional testing is a little more complicated than the continuity test. It tests whether the device works as a functional block. Parametric testing is the final and most complex test of the device. This test checks for device performance within the given specifications. The data is stored in a tester database associated with the tester controller. The results of the tests and the selected sorting algorithm determine if the device is functional, as well as which bin the device should be categorized in. Because the circuitry and performance characteristics of each device type is unique, each device type will usually require a unique testing program customized to measure the most relevant parameters. Accordingly, for a large family of devices and device types, a large number of testing programs exist.

Traditional automatic test equipment (ATE) incorporates expensive, high performance pattern memory sub-systems to deliver complex test patterns to the devices. These sub-systems are designed to deliver wide patterns (typically 128 to 1024 bits) at high speeds (typically 20 to 100's MHz, more than 300 MHz on new devices). The depth of the pattern storage is typically 1 to 64 million. The width, speed and depth of the pattern memory requirements, along with the sequencing capability (loops, branches, etc.) combine to significantly affect the cost of the pattern subsystem, to the extent that most pattern subsystems represent a significant component of the overall ATE cost.

The traditional pattern memory subsystem limitations are often the source of test program development problems and initial design debug inefficiencies. The number of test patterns required is proportional to the number of transistors in a device. As the device integration rapidly progresses in accordance with Moore's Law, the corresponding test pattern requirements will present increasingly difficult challenges for cost-effective traditional pattern memory sub-systems.

The goal of avoiding an expensive burn-in procedure and replacing it by a low-cost, fast, reliable and flexible procedure has been difficult to achieve. Accordingly, a need has arisen for a coherent approach to both a low-cost method and a low-cost testing equipment offering a fundamental solution not only to avoid burn-in, but to guarantee quality and reliability of semiconductor devices in general, and to achieve these goals with testers of much reduced cost. The method should be flexible enough to be applied for different semiconductor product families and a wide spectrum of design and process variations and should lend itself as a guiding tool during wafer fab processing as well as after testing at multiprobe and after assembly and packaging. The method and the testers should increase manufacturing throughput and save floor space, time and energy. In addition, to improve the throughput and thereby reduce the cycletime of testing steps, the testing method and apparatus should have the ability to simultaneously test multiple devices.

Many of the problems associated with costly testing equipment have been addressed by the testing method and apparatus described in U.S. patent application Ser. No. 09/413,926 entitled "Testing Method and Apparatus Assuring Semiconductor Device Quality and Reliability," which has a filing date of Oct. 7, 1999 and which is hereby incorporated by reference into this application. To date, however, the method and apparatus described in this patent application has not been utilized to perform simultaneous testing of multiple devices.

BRIEF SUMMARY

As described above, simultaneous testing of multiple devices has been difficult to effectively implement because the timing of the test signals on many testing systems was required to be calibrated. New methods and systems, such as the method and system described in U.S. patent application Ser. No. 09/413,926, have reduced the need for calibrated test signals. By reducing the need for calibrated test signals, it has become possible to provide uncalibrated test signals to multiple devices for simultaneous testing. The method and apparatus disclosed herein utilizes the testing methods and systems described in U.S. patent application Ser. No. 09/413,926, along with an improved testing apparatus an method to allow simultaneous testing of multiple devices.

An aspect of one embodiment of the invention is an improved DMA controller that automatically selects certain pin groups, which are connected to a common data bus, to read or write test data to a common data bus. By selecting more than one pin group at the same time, test data (such as a test data word) can be simultaneously loaded onto multiple pin cards at the same time. By loading this data into multiple pin cards at the same time, test data can be "fanned-out" to multiple pin cards and thereby be sent to multiple device sites at the same time, thereby enabling simultaneous testing. Another aspect of one embodiment of the invention utilizes DMA-based hardware to select which pin groups should received "fanned-out" test data. By utilizing DMA-based hardware to fan-out the test data, the software-based test programs and patterns may be created to manipulate a single device. The test program may select the number of sites to be tested and partition the tester resources to those sites. The DMA-based hardware and tester software will automatically fan-out the test data to all of the appropriate test sites.

Yet another aspect of one embodiment of the invention allows the testing system to selectively enable or disable testing of specific device. In this manner, devices that fail certain preliminary tests, such as continuity tests, can be disabled and testing of these devices is bypassed for subsequent parametric and functional tests. Another aspect of this embodiment utilizes a pass/fail register on a DMA card that can be updated during the testing of a device to indicate whether that device should receive further testing. The improved testing method and system disclosed herein can be applied to wafer-level testing, as well as post-packaging testing.

The aspects and embodiments summarized above have been provided to enable an understanding of the disclosed system and method, and should be construed as a recitation of any "essential" elements of the invention. Indeed, there are many other aspects and embodiments that have not been discussed in the Brief Summary. The technical advances represented by the invention, as well as the objects thereof, will become apparent from the following detailed description, when considered in conjunction with the accompanying drawings and the novel features set forth in the appended claims.

BRIEF DESCRIPTION OF THE DRAWINGS

FIG. 2 is a block diagram depicting several components of one embodiment of an improved testing apparatus for simultaneously testing multiple devices.

FIGS. 6C-1 and 6C-2 are block diagrams of another portion of a pin group selection device associated with an improved DMA card suitable for use with an improved testing apparatus.

FIGS. 6D-1 to 6D-3 are block diagrams of yet another portion of a pin group selection device associated with an improved DMA card suitable for use with an improved testing apparatus.

FIGS. 6E-1 to 6E-3 are block diagrams of one embodiment of a multi-site pin group select register, multi-site pin group select gates, and pin group enable circuitry.

DETAILED DESCRIPTION

Figure 6A:
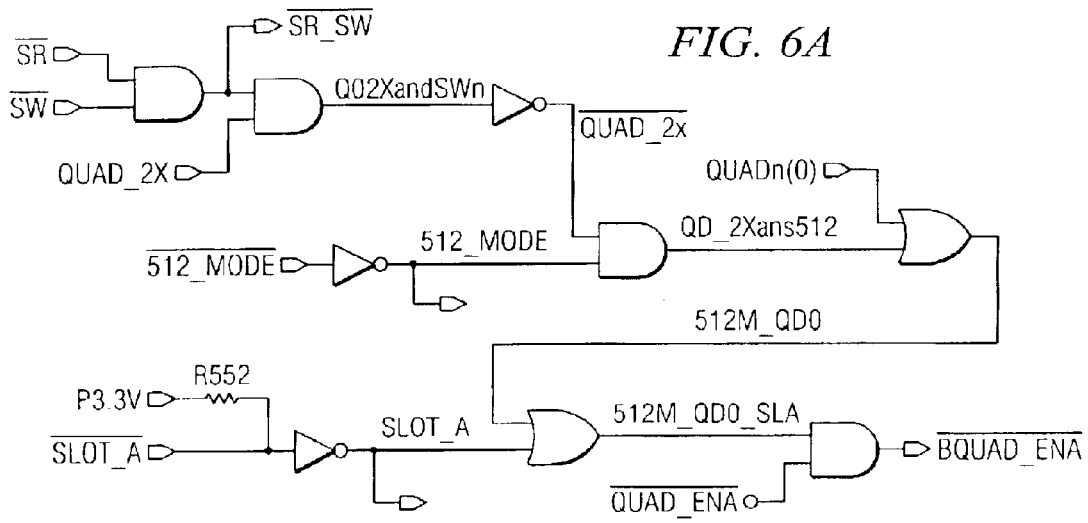
FIG. 6A is block diagram of one embodiment of a quadrant enable device associated with an improved DMA card suitable for use with an improved testing apparatus.
Figure 6F:
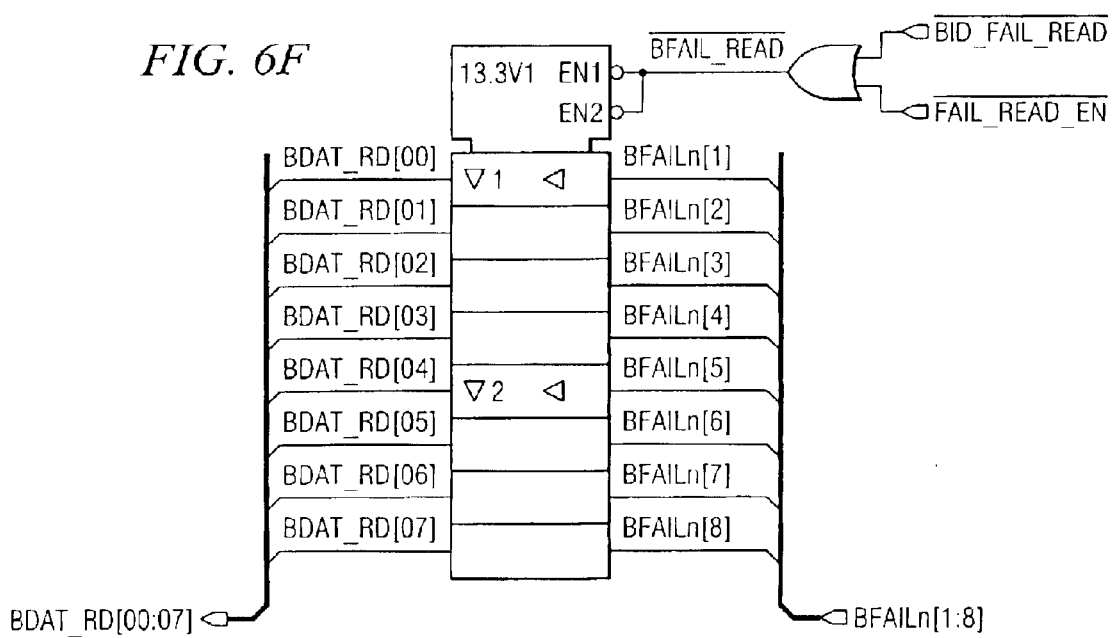
FIG. 6F is block diagram of one embodiment of a fail readback device associated with an improved DMA card suitable for use with an improved testing apparatus.
Figure 6B:
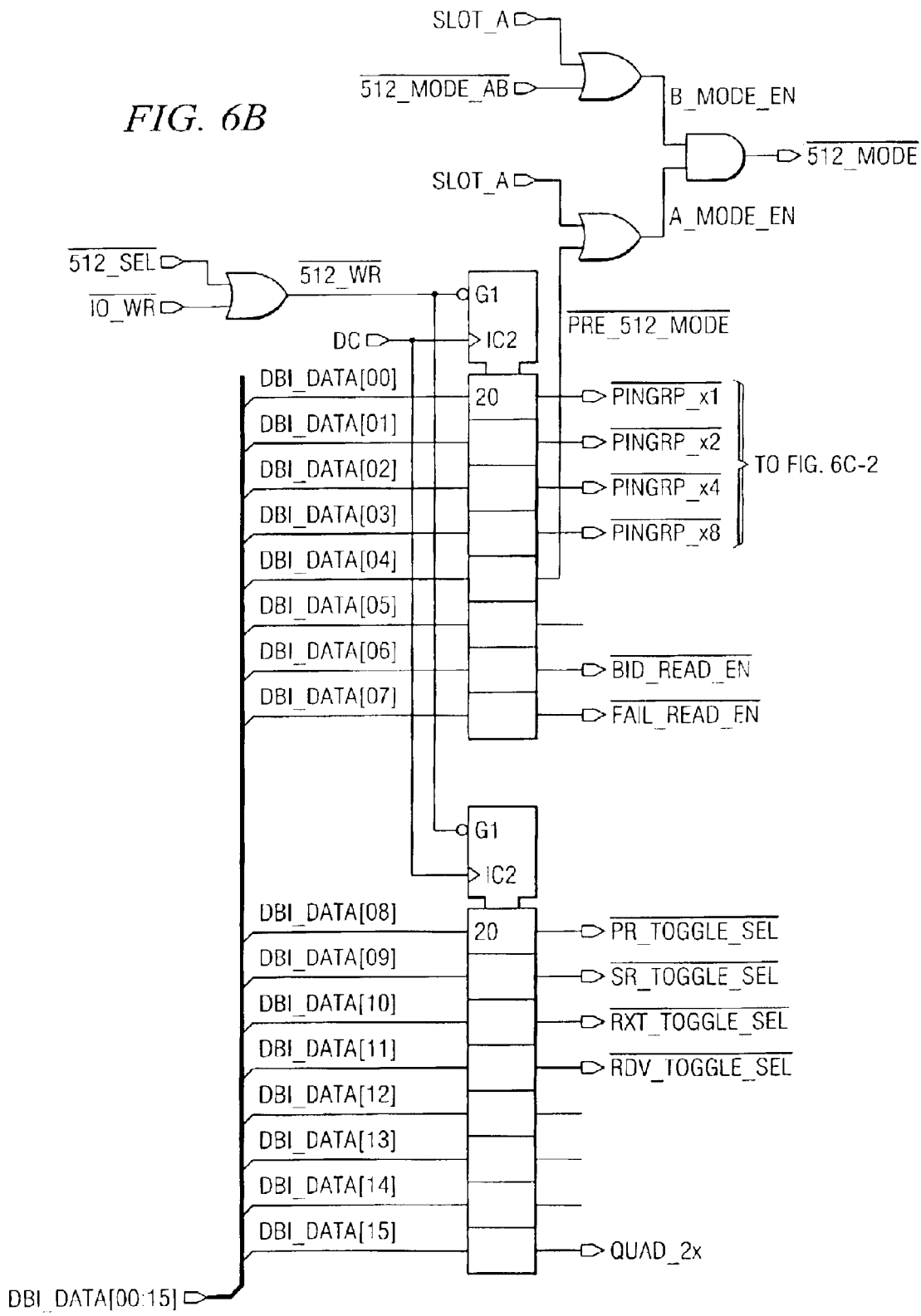
FIG. 6B is block diagram of a portion of a pin group selection device associated with an improved DMA card suitable for use with an improved testing apparatus.
Figures 1, 6C:
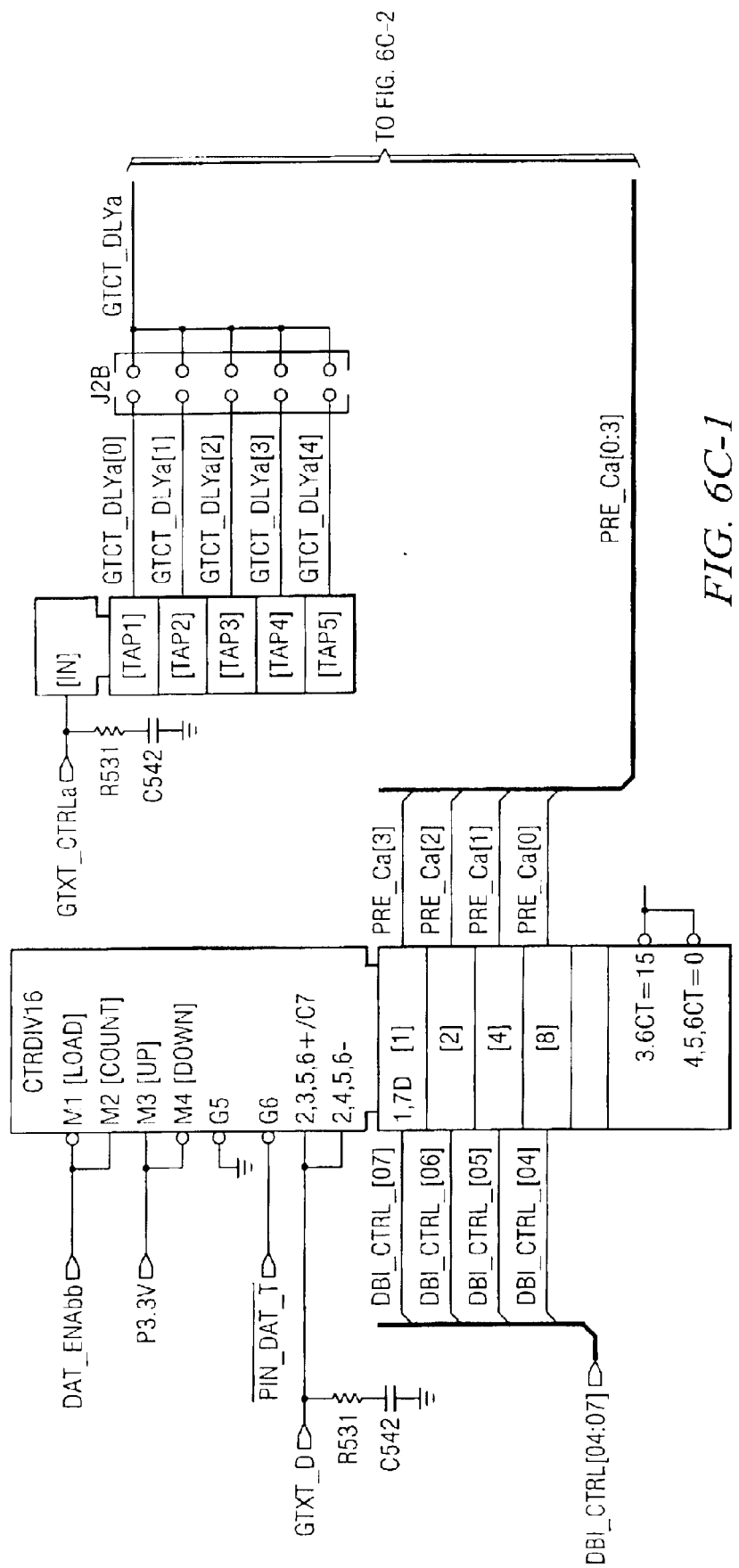

A block diagram depicting a high-level view of an improved testing apparatus 100 is depicted in FIG. 1. In FIG. 1, a tester controller 105 is connected to a direct memory access (DMA) controller 110 and to a plurality of pin cards 115 through a common data bus 120. According to principles well known in the art, the DMA controller 110 controls the flow of data between the tester controller 105 and the pin cards 115 through the data bus 120. A tester database 125 can also be used to store test data that is to be utilized by the testing apparatus 100. The tester database 125 can also be used as a repository for test data that is retrieved from the tested devices. Also depicted in FIG. 1 is a probe card 127, to which one or more device probes 130 can be connected. The device probes 130 are arranged on the probe card 127 so that they can be simultaneously connected to one or more devices 135 140. The position of the device probes 130 with respect to the devices 135 on the wafer 140 can be controlled by moving the wafer 140 with a movable wafer stage (not shown), or by moving the probe card 127.

The tester controller 105 comprises a computer such as a desktop personal computer or a workstation, such as a SPARC station or a PC. The tester controller 105 also comprises one or more testing programs operable to provide pattern sequence control, pattern memory, scan memory, timing system and driving signal formats. Much of this information can be stored in the tester database 125.

The pin cards 115 are generally mounted in a tester subsystem and provide an interface between the data bus 120 and the probe card 127. A variety of embodiments may be used to connect the probe card 127 to the data bus 120. According to one embodiment, a plurality of pin cards 115 are mounted in parallel along the data bus 120 to receive data from and provide data to the tester controller 105. Each of these pin cards may be selectively activated by the DMA controller 110. Each of the pin cards 115 may also comprise a 16 bit or 32 bit interface depending upon the size of the data bus 120 and the hardware found within the pin card.

According to one embodiment, the testing apparatus 100 can handle devices with as many as 1024 pins. The testing apparatus 100 can also perform DC tests including continuity, voltage box (Vdd ult min and Vdd ult high), input leakage, and Iddq (240 pA resolution) tests; further performs slow functional, scan, algorithmic, delay fault, and at-speed BIST tests (providing speeds of 800 MHz and higher). More specific information about these tests is provided in U.S. patent application Ser. No. 09/413,926, referenced above.

Figure 1A:
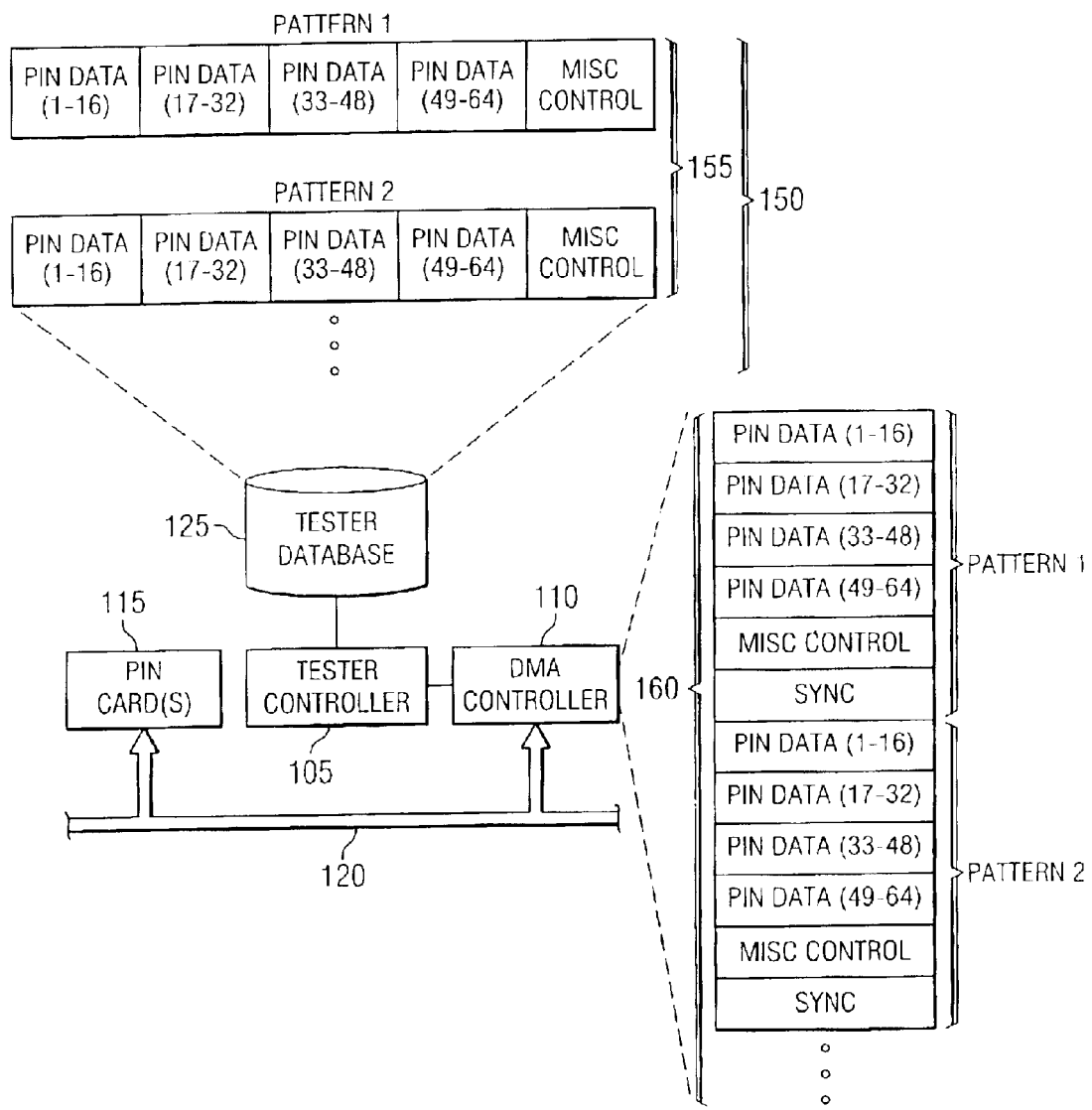
FIG. 1A is a block diagram depicting representative data blocks utilized by one embodiment of the improved testing apparatus.

FIG. 1A gives an example how test patterns, which are stored in the tester database 125 as DMA blocks, are transferred to a device under test (DUT) for digital stimulus and response comparison during testing. Although the pattern data is not transferred "at speed" to the device under test, the use of DMA techniques ensures that the patterns are transferred as efficiently as possible, in order to minimize test time. In FIG. 1A, the data bus 120 is 16 bits wide and operates at 33 MW/s (million words per second). Therefore, all data and control during the pattern execution must be transferred at 33 MHz from the tester controller 105 via the 16 bit DMA bus 120. If 256 data bits are required to change state (for example, for a 256 pin device), at least 16 DMA words would be required for 1 pattern. Furthermore, some control overhead is required to direct the data bits to the proper device pin groups, and also to accommodate pattern changes beyond simple digital states (for instance, DUT output masking or bi-directional pin control). Therefore, although the DMA transfer rate is 33 MW/s, the effective pattern rate will be slower because of the required data-to-pin mapping and other control.

FIG. 1A further depicts an example of how a traditional parallel pattern can be stored as a 16-bit wide DMA sequence. In FIG. 1A, the traditional parallel pattern is generally designated 150; it is comprised of 64 bits of digital state data, arranged in groups of 16 bit words, plus control information, for 2 pattern cycles 155. The same pattern can be stored and executed as a DMA stream, as indicated by 160. The data for each pin group is sequentially updated along with control information, followed by a synchronization cycle. The synchronization cycle is used to update all pattern data simultaneously at the DUT.

The pattern execution speed of the tester apparatus depicted in FIG. 1A is somewhat limited in comparison with existing "at-speed" testers. However, the test methods used in the test strategy employed herein generally do not rely on traditional at-speed functional tests. Instead, device performance is verified using at-speed BIST, DFT techniques, internal test structures or other parameter measurements that do not require fast pattern execution.

Figures 2, 6C:
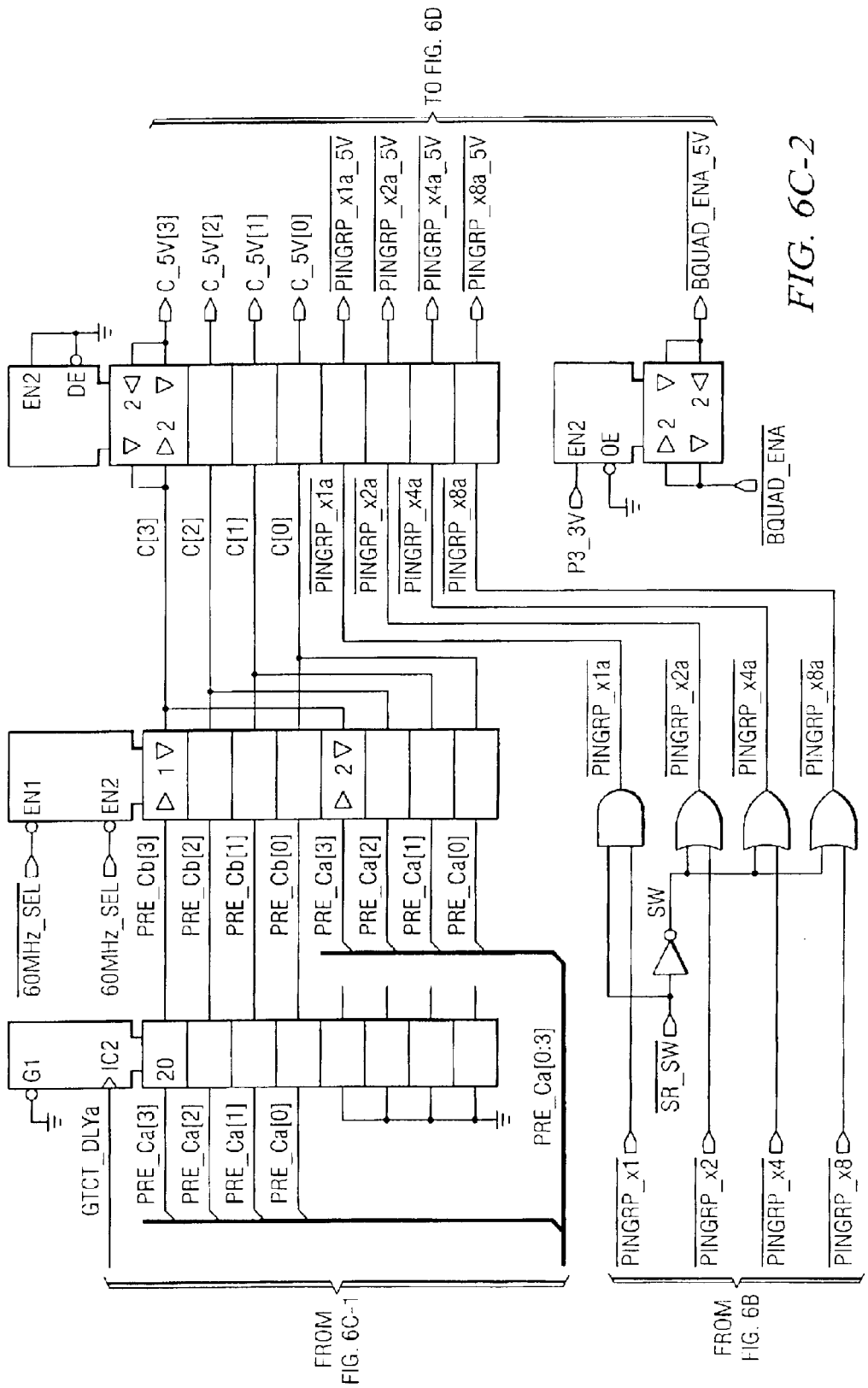

A more detailed illustration of some of the components of the testing apparatus 100 is depicted in FIG. 2. Much like FIG. 1, the DMA controller 110 and the pin cards 215*a*–215*h* are all connected to a common data bus 120. In addition, the tester controller 105 and each of the pin cards 215*a*–215*h* further comprise an input/output buffer 230 that is used to control the flow of data into and out of each of these components. Each of the input/output buffers 230 is controlled by the DMA controller 110. In the embodiment depicted in FIG. 2, each of the pin cards 215*a*–215*h* has associated therewith at least one pin group. For example, pin card 1 is associated with pin groups 0 and 1. Each of these pin groups typically comprises 16 bits, each of which corresponds directly to a pin on a device probe 130. Other embodiments, however, may utilize more or fewer bits per pin group, depending upon the size of the data bus 110. Typically, a device that required 256 pins on a device probe 130 would therefore require 16 pin groups, each of which having 16 bits. Of course, not all devices will require this many pins in order to complete a successful test. As a result, 1 or 2 pin cards may be sufficient to provide all of the pins necessary to test a device. For example, the embodiment depicted in FIG. 1 utilizes a system that simultaneously tests four devices at a time. Accordingly, each of the devices 135 to be tested would generally utilize a maximum of 64 pins in each the device probes 130. As a result, each device would require four pin groups and two pin cards 215 to provide all of the data necessary to perform the test.

Figure 3:
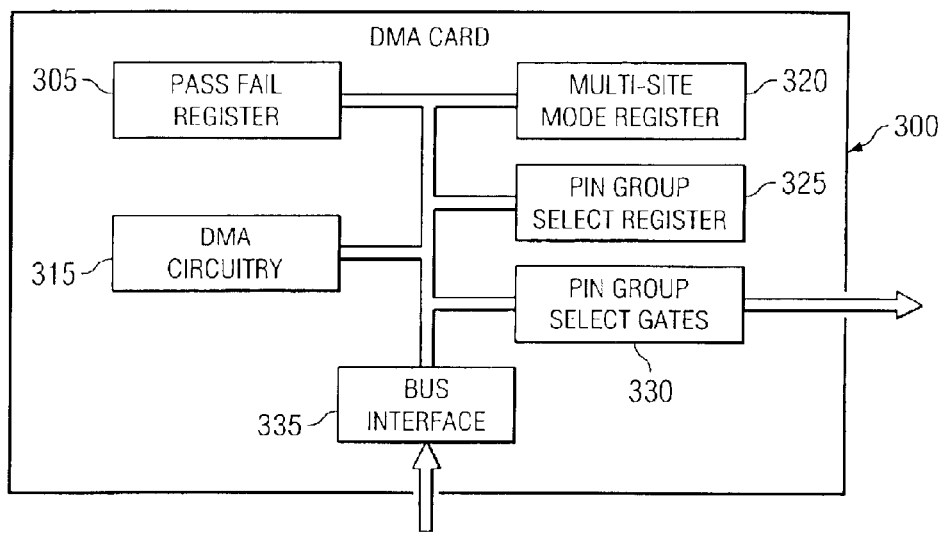
FIG. 3 is a high-level block diagram depicting one embodiment of an improved DMA card suitable for use with an improved testing apparatus.

In order to capitalize on the repetitive data to be provided to the pin cards, and also to ensure parallel processing of data, an improved DMA card 300 is utilized to control the flow of data between the tester controller 105 and the pin cards 115. A high level block diagram of an improved DMA card 300 is depicted in FIG. 3. The embodiment depicted in FIG. 3 comprises several components, including a pass-fail register 305, DMA circuitry 315, a multi-site mode register 320, a pin group select register 325, pin group select gates 330, and a bus interface 335. The pass-fail register 305 comprises a set of binary bits, each of which corresponds to the pass-fail status of particular pin groups or pin cards associated with a particular device being tested. This register is used to provide pass-fail data both to the DMA card 300 and to the tester controller 105 during testing of the devices. This register may be asynchronously updated with pass-fail data as the devices are being tested so that simultaneous testing of certain devices can be eliminated if they are found to be failing. The DMA circuitry 315 comprises logic gates, buffers, and other components necessary to perform the functions of a DMA controller. The multi-site mode register 320 is a register indicating which mode the testing system is operating in. According to one embodiment, the multi-site mode register may comprise a 4 bit register, each of the bits corresponding to four different multi-site modes (X1, X2, X4, and X8) in which the system can operate. The four modes, X1, X2, X4 and X8, represent the simultaneous testing of one, two, four or eight devices, respectively. The pin group select register 325 is used to indicate which pin groups should be activated for a shared-read or shared-write operation. The pin group select gates 330 combine the data from the various registers in order to activate or deactivate certain input/output buffers associated with selected pin groups. As depicted in FIG. 2, the pin group select gates provide signals to each of the input/output buffers 230 associated with each of the respective pin cards 215.

Figure 4:
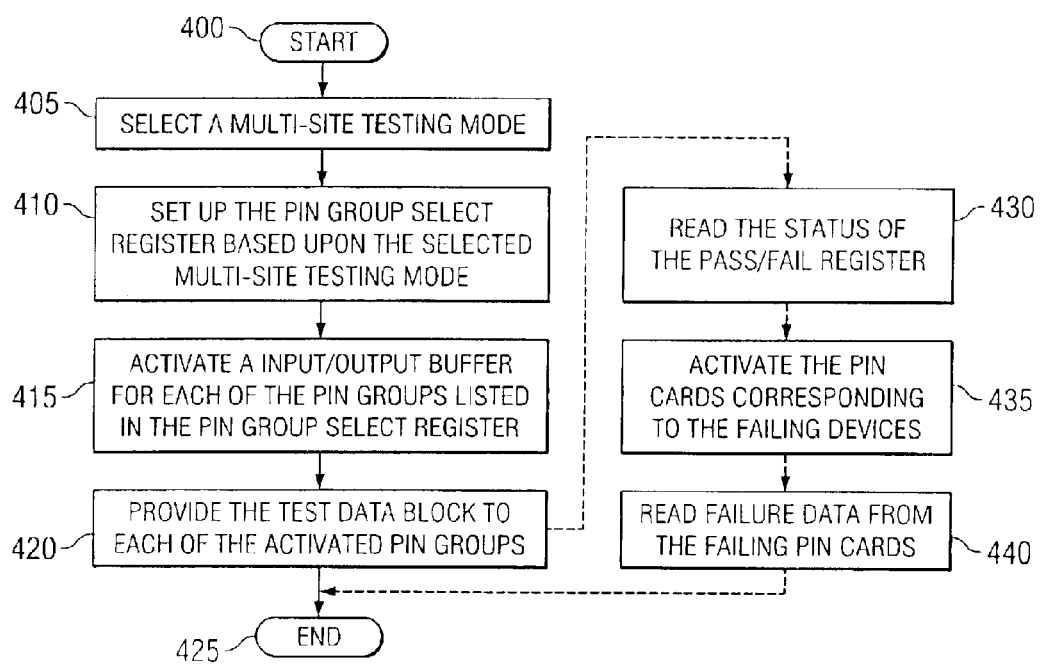
FIG. 4 is a process flow diagram depicting a representative process for fanning out data from the tester controller to a plurality of pin groups.

The process by which a set of test data is fanned-out and written to a plurality of probe sites through the respective pin cards is depicted in FIG. 4. The process starts (400) by first selecting a multi-site testing mode (405). As stated previously, this multi-site testing mode can correspond to a fan-out of data to 2, 4, 8 or even 16 devices at the same time. Next, the DMA-based hardware sets up the pin group select register based upon the multi-site testing mode that has been selected (410). After this, the input/output buffers corresponding to each of the pin groups listed in the pin group select register are activated (415). After the input/output buffers have been activated, a block of test data is provided to the activated pin groups through the data bus (420). Typically, the block of test data will correspond to an entire test process or subprocess that is being performed on a device. Because the appropriate input/output buffers have been activated for each corresponding device to be tested, the test data will automatically be fanned out to multiple devices at the same time. After the entire test data block has been provided, the process is complete (425).

Also depicted in FIG. 4 are three optional steps that can be performed according to one embodiment of the system.

After the test data block has been provided to the activated pin groups, the system can check the status of the pass/fail register (430). As stated previously, the pass/fail register on the DMA board can be updated asynchronously from testing process. Accordingly, if a device has failed a test corresponding the test data block, the pass/fail register will immediately indicate so. If a failing device is found, then the pin cards corresponding to the failing devices will be activated (435) in serial order so that failure data is read from the pin cards corresponding to the failing devices (440). This data can then be stored in the tester database 125 for further processing.

Figure 5A:
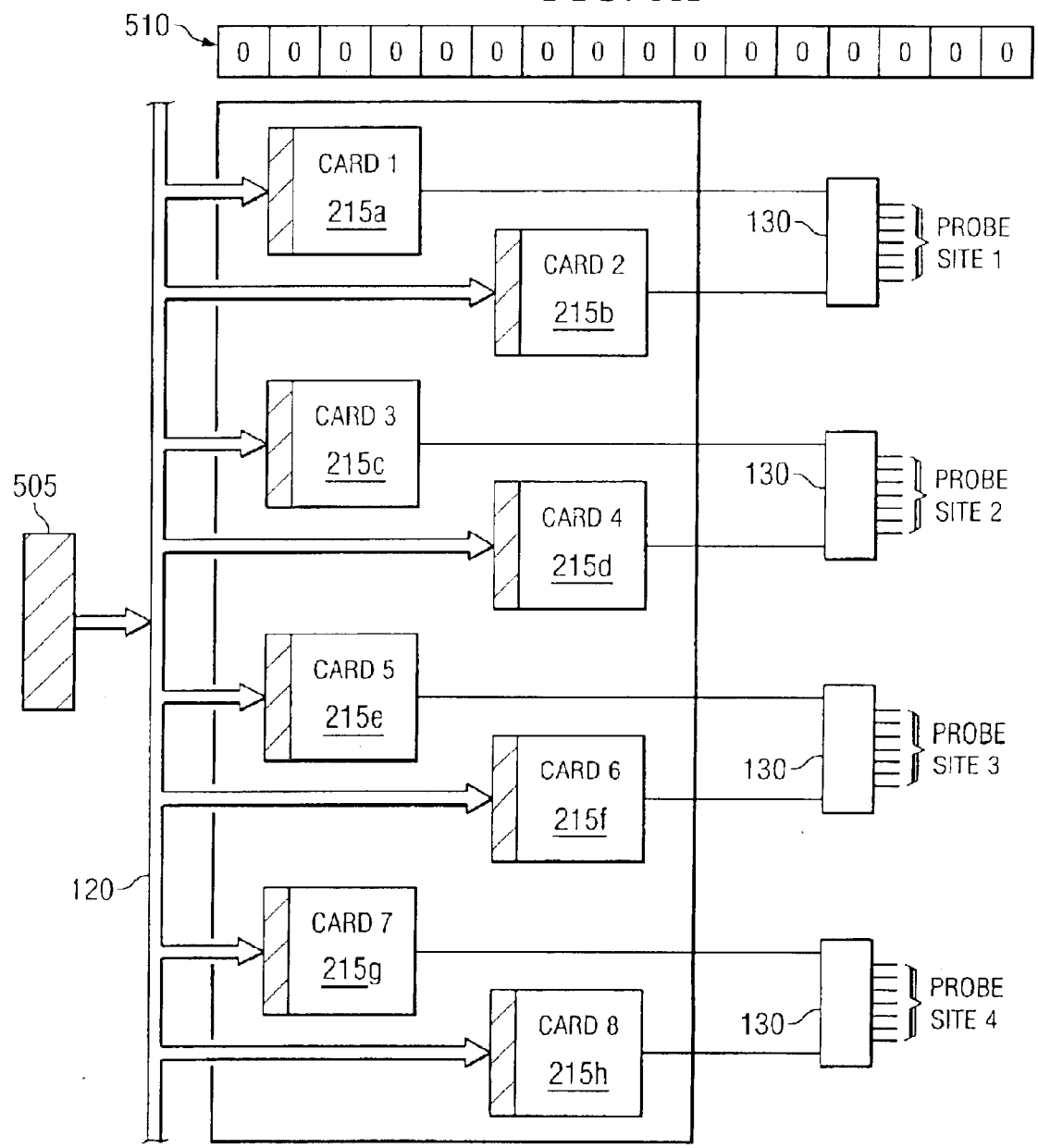
FIGS. 5A and 5B are block diagrams depicting the process by which a test data word is simultaneously written to a plurality of pin groups.
Figure 5B:
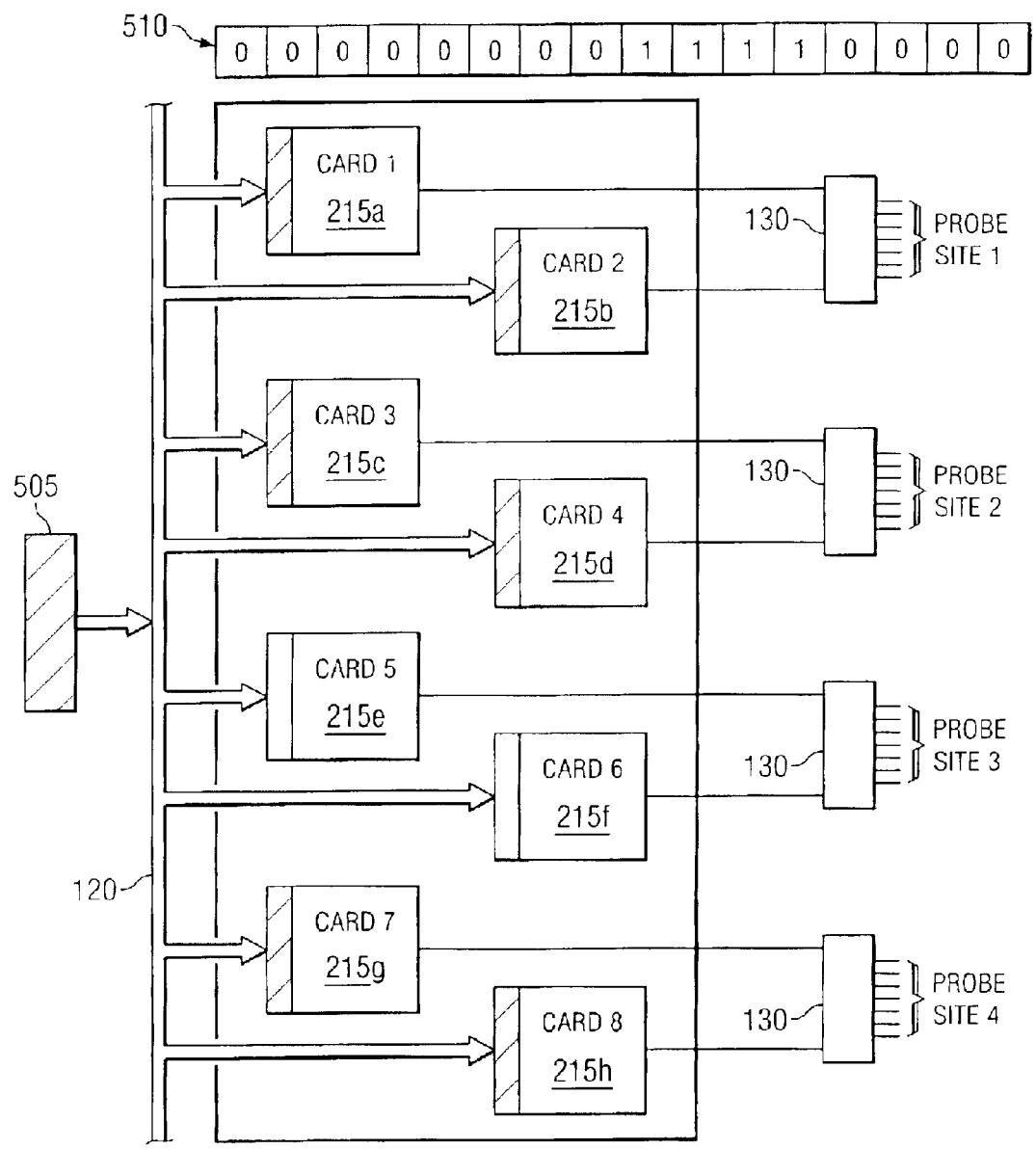

The process of masking off certain failing devices from further tests is depicted in FIGS. 5A and 5B. In FIG. 5A, a test data word 505 is provided to the data bus 120. At the same time, the pin group status register 510 has been populated with all 0s, thus indicating that the test data block should be written to all of the pin groups. Accordingly, the input/output buffers corresponding to pin cards 1–8 (215a–215h) are activated. As a result, the test data words will be stored in the input/output buffer of all of these cards.

In FIG. 5B, the device corresponding to probe site 3 has been marked off from further testing. This can be done for a variety of reasons, such as a failure of the device or a direct command from the tester controller. Because the pin sites corresponding to probe site 3 have been masked-off, the pin group status register 510 has been populated with is at locations 9–12. Accordingly, when the input/output buffers are activated for a further test, pin cards 5 and 6 (215e and 215f) will be masked off from the shared write.

One embodiment of a quadrant enable device associated with an improved DMA card suitable for use with an improved testing apparatus is depicted in FIG. 6A. This circuit allows one DMA card to pass control to another DMA card which has its own bus, thereby enabling another set of sixteen pin groups (and eight pin cards) to be utilized with the improved testing apparatus 100. This effectively doubles the capacity of the improved testing apparatus allowing up to 16 devices to be tested at the same time.

A portion of a representative pin group selection device associated with an improved DMA card is depicted in FIG. 6B. In FIG. 6B, appropriate data from the data bus in the DMA card (DBI_DATA[00-15]) is used to indicate what multi-site mode (X1, X2, X4, or X8) the DMA card is operating in.

Another portion of a representative pin group selection device associated with an improved DMA card is depicted in FIG. 6C. The circuitry depicted in FIG. 6C selects the appropriate pin groups which data will be written to or read from during a write or read operation.

Figure 6D:
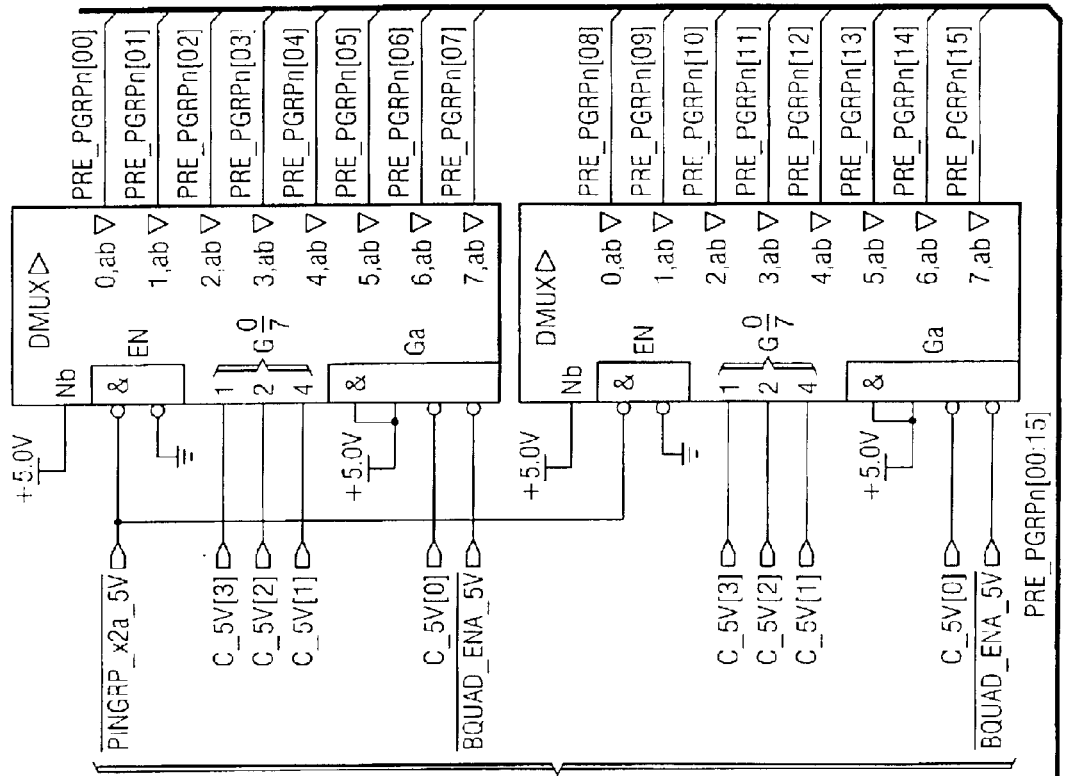
Figure 1:
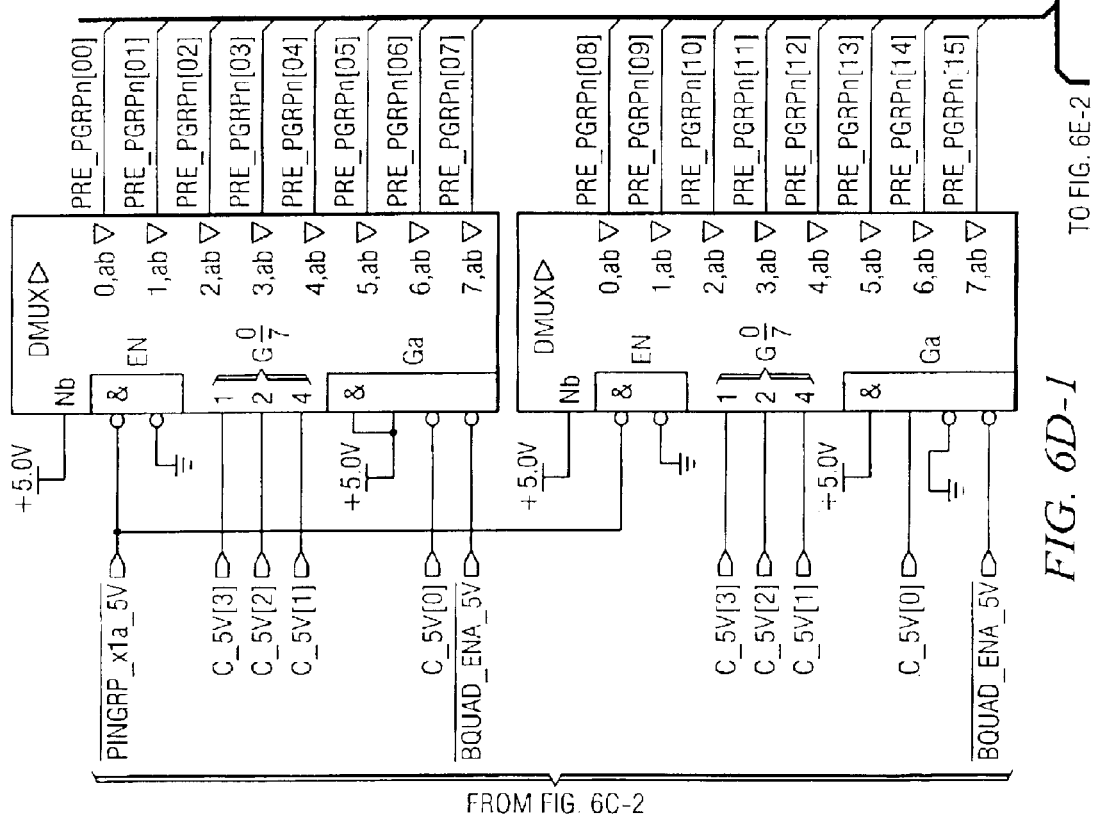
FIG. 1 is high-level block diagram depicting one embodiment of an improved testing apparatus for simultaneously testing multiple devices.
Figures 2, 6D:
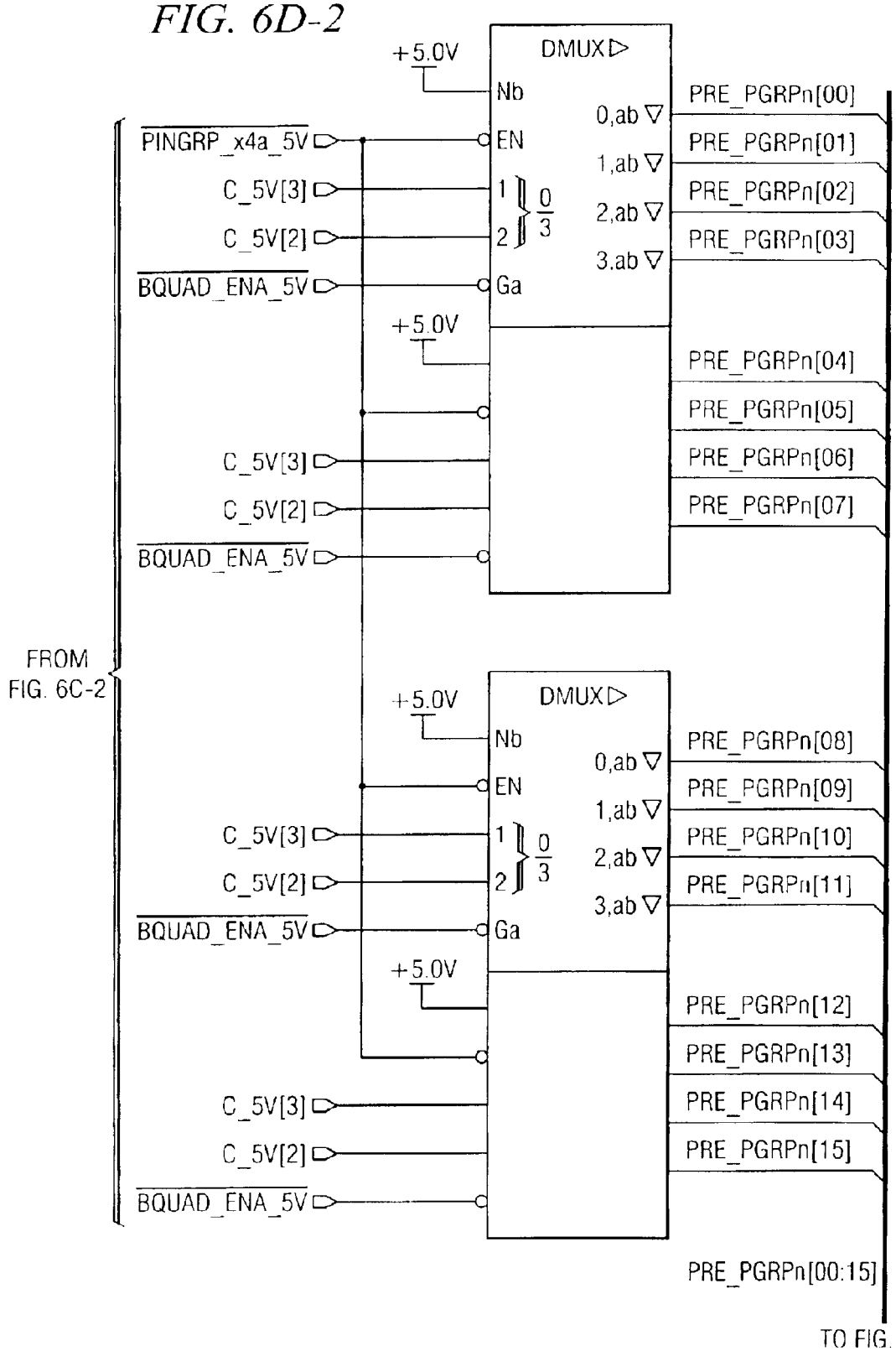
Figure 6D:
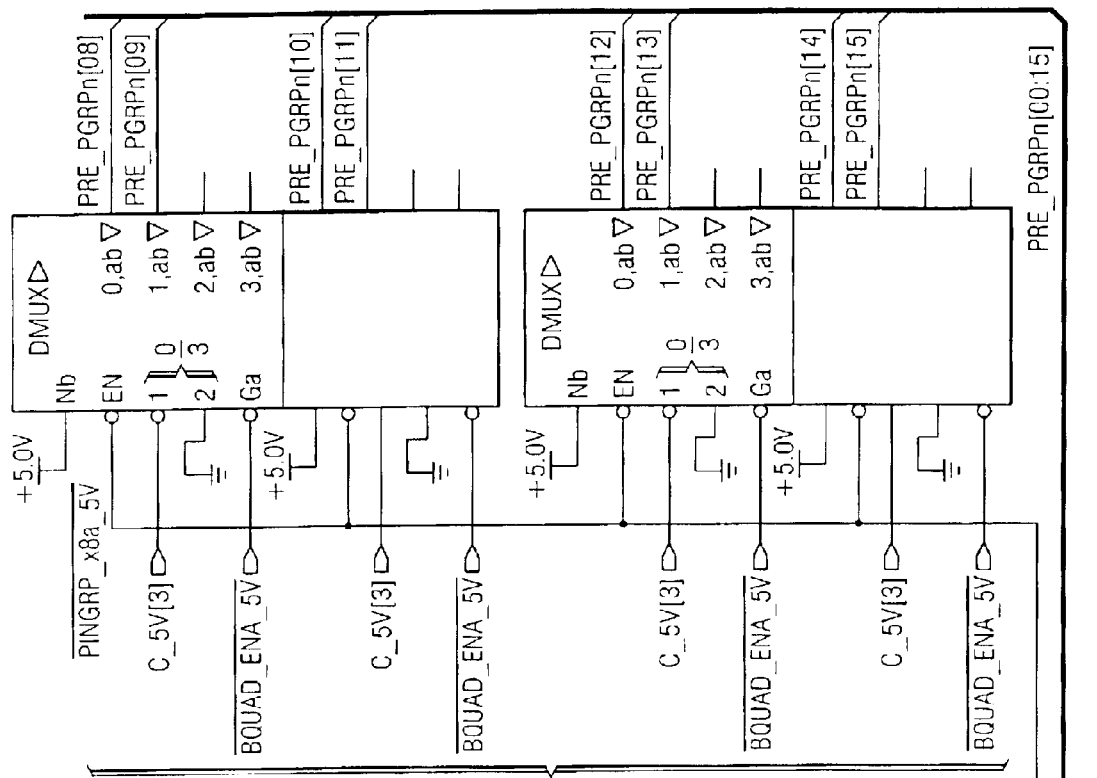
Figure 3:
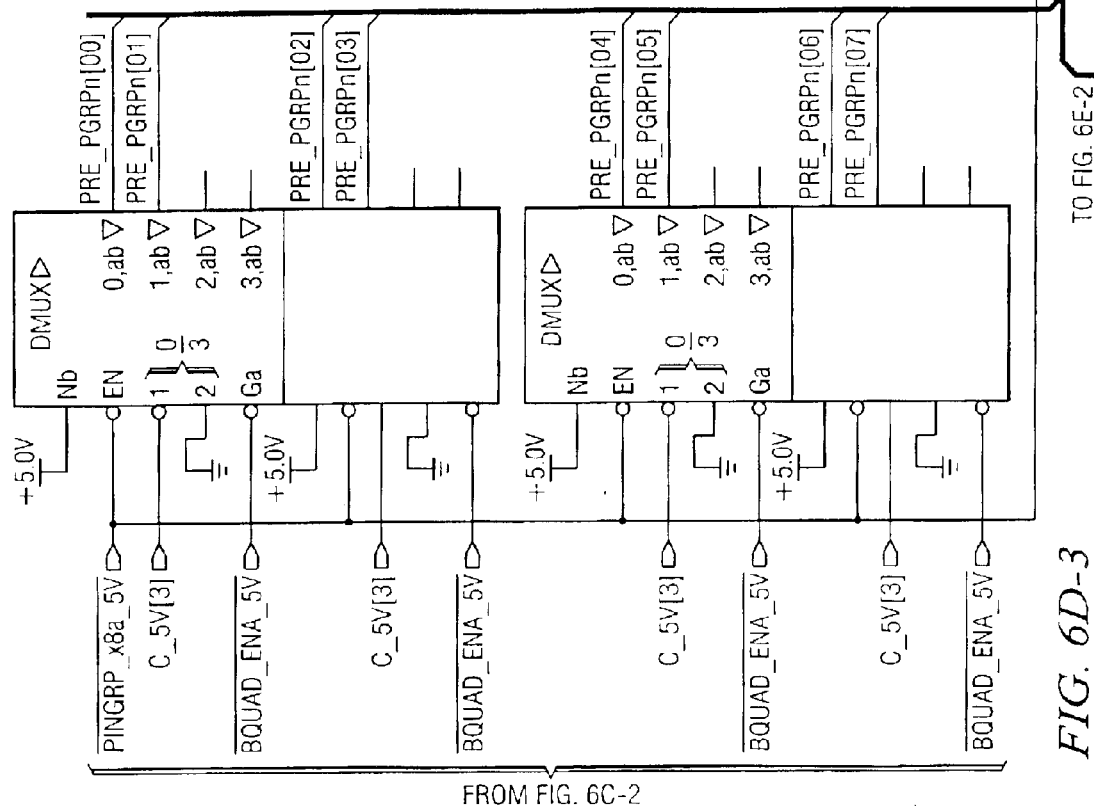

Another portion of a representative pin group selection device associated with an improved DMA card is depicted in FIG. 6D. The circuitry depicted in FIG. 6D demultiplexes the data provided by the circuitry in FIG. 6C and activates certain pin group lines for a read or write operation.

Figures 1, 6E:
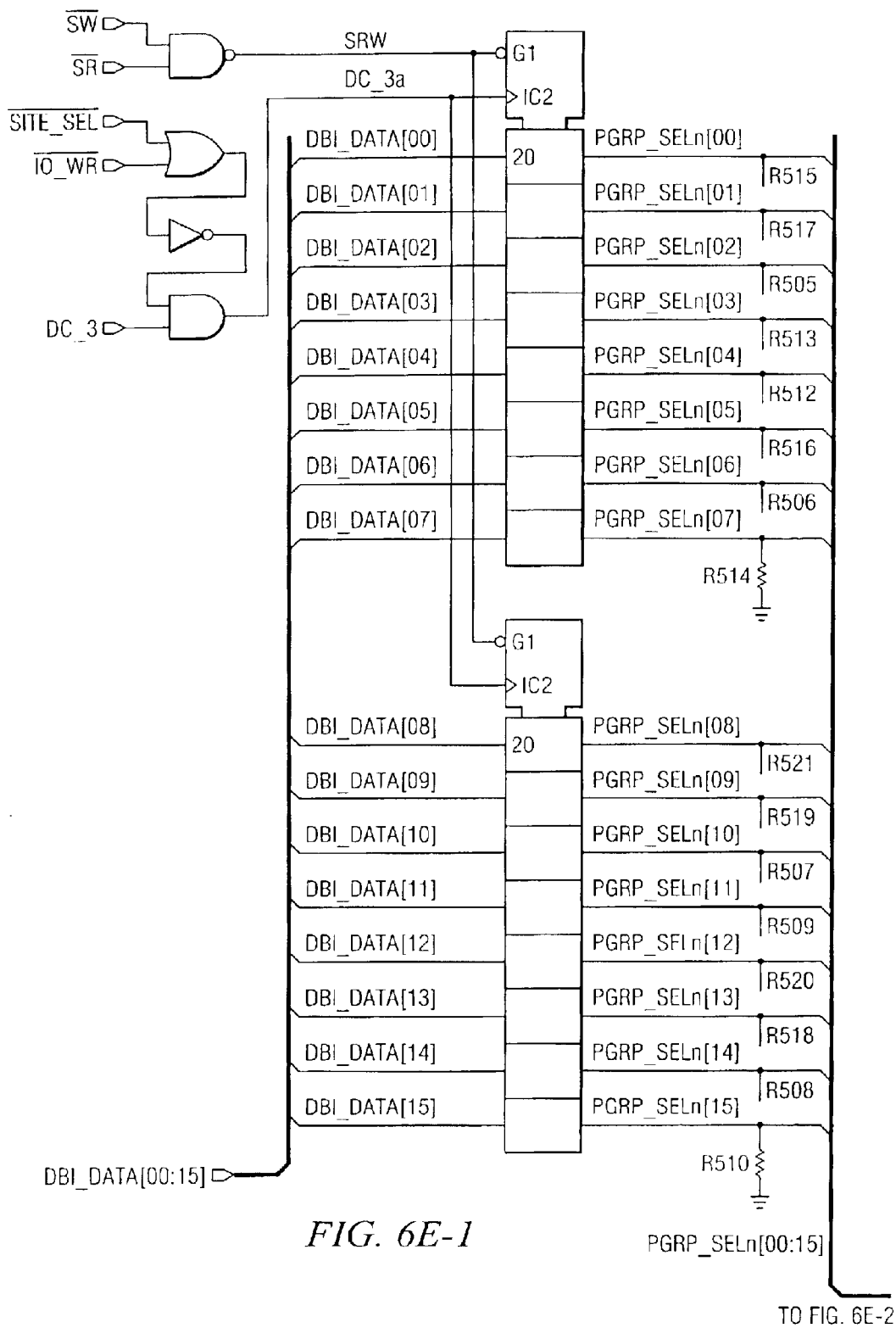
Figures 3, 6E:
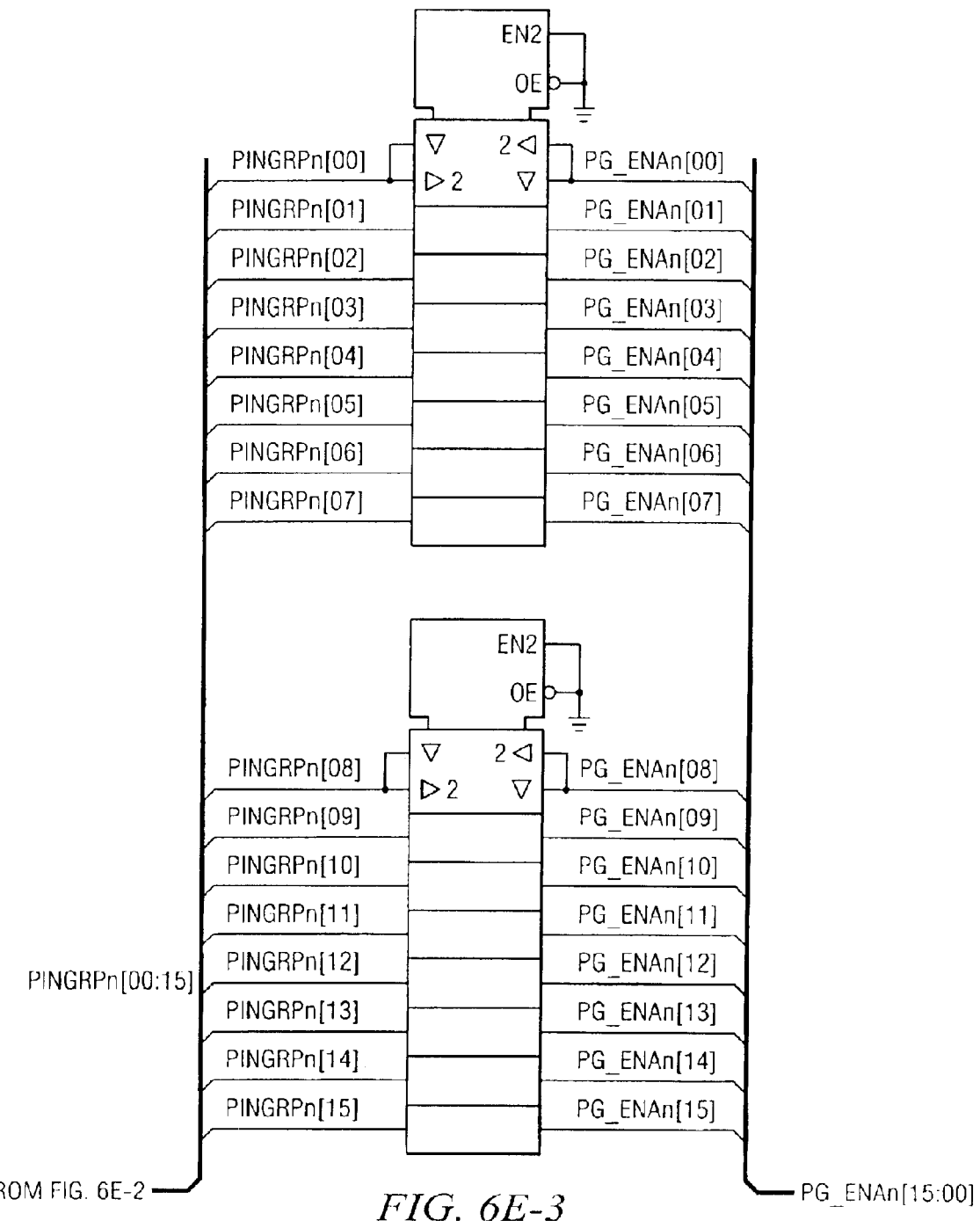

FIG. 6E depicts a representative embodiment of a multi-site pin group select register, multi-site pin group select gates, and pin group enable circuitry suitable for use on an improved DMA card. The circuitry depicted in FIG. 6E compares the pin group select lines provided by the circuitry of FIG. 6D with signals provided by the multi-site pin group select register in order to activate certain pin groups for a read or write operation.

A block diagram of one embodiment of a fail readback device associated with an improved DMA card is depicted in FIG. 6F. The disclosed fail readback device accepts fail data asynchronously provided by the tested devices and writes that data in an appropriate pass/fail register.

Although certain embodiments and aspects of the present inventions have been illustrated in the accompanying drawings and described in the foregoing detailed descriptions, it will be understood that the inventions are not limited to the embodiments disclosed. Further, the inventions are capable of numerous rearrangements, modifications and substitutions without departing from the spirit of the invention as set forth and defined by the following claims and equivalents thereof. The Applicants intend that the claims shall not invoke the application of 35 U.S.C. § 112, ¶ 6 unless the claim is explicitly written in means-plus-function or step-plus-function format.

We claim:

1. A testing signal fan-out apparatus operable to activate at least one pin group to receive a testing signal word from a data bus, the fan out apparatus comprising:
    a pin group select register operable to indicate one or more pin groups that are to receive a set of testing signals;
    a multi-site test register operable to indicate whether more than one device site is to be tested simultaneously;
    pin group select circuitry operable to read the multi-site test register and write corresponding pin group selection data to the pin group select register; and
    pin group enable circuitry operable read the pin group select register and activate one or more pin cards that are to receive a testing signal word from the data bus.

2. A testing signal fan-out apparatus according to claim 1, wherein each of the pin groups corresponds to a pin card.

3. A testing signal fan-out apparatus according to claim 1, wherein each pin card is associated with two pin groups.

4. A testing signal fan-out apparatus according to claim 1, wherein the pin group select register comprises a plurality of bits, each of the bits corresponding to a pin group for a device to be tested.

5. A testing signal fan-out apparatus according to claim 4, wherein the pin group select register comprises 16 bits.

6. A testing signal fan-out apparatus according to claim 1, wherein the multi-site test register comprises a four bit register, each of the bits corresponding to a respective multi-site mode.

7. A testing signal fan-out apparatus according to claim 1, wherein the multi-site test register comprises a multiple bit register, each of the states of the register corresponding to a respective multi-site mode.

8. A testing signal fan-out apparatus according to claim 6, wherein the four bits of the multi-site test register correspond to an X1 mode, an X2 mode, an X4 mode, and an X8 mode, respectively.

9. A testing signal fan-out apparatus according to claim 1, further comprising a pass/fail register operable to indicate a pass/fail status for one or more devices to be tested;
    wherein the pin group select circuitry is operable to read the multi-site test register and the pass/fail register and write corresponding pin group selection data to the pin group select register.

10. A testing signal fan-out apparatus according to claim 9, wherein the pass/fail register comprises a plurality of bits, each of the bits corresponding to a device to be tested.

11. A testing signal fan-out apparatus according to claim 9, wherein the pass/fail register can be asynchronously updated with failure data during the testing of the one or more devices.

* * * * *